United States Patent
Lee et al.

(10) Patent No.: US 9,711,693 B2
(45) Date of Patent: Jul. 18, 2017

(54) METHOD OF FABRICATING SEMICONDUCTOR DEVICE USING GANG BONDING AND SEMICONDUCTOR DEVICE FABRICATED BY THE SAME

(71) Applicants: Chung Hoon Lee, Ansan-si (KR); Dae Sung Kal, Ansan-si (KR); Ki Bum Nam, Ansan-si (KR)

(72) Inventors: Chung Hoon Lee, Ansan-si (KR); Dae Sung Kal, Ansan-si (KR); Ki Bum Nam, Ansan-si (KR)

(*) Notice: Subject to any disclaimer, the term of this patent is extended or adjusted under 35 U.S.C. 154(b) by 0 days.

(21) Appl. No.: 14/731,046

(22) Filed: Jun. 4, 2015

(65) Prior Publication Data

US 2015/0270454 A1    Sep. 24, 2015

Related U.S. Application Data

(63) Continuation of application No. 13/992,941, filed as application No. PCT/KR2011/004776 on Jun. 30, 2011, now Pat. No. 9,054,231.

(30) Foreign Application Priority Data

Dec. 10, 2010  (KR) .................. 10-2010-0126218

(51) Int. Cl.
*H01L 33/50* (2010.01)
*H01L 23/00* (2006.01)
(Continued)

(52) U.S. Cl.
CPC ...... *H01L 33/507* (2013.01); *H01L 23/49805* (2013.01); *H01L 24/11* (2013.01);
(Continued)

(58) Field of Classification Search
CPC . H01L 2224/11466; H01L 2224/16013; H01L 2224/11462; H01L 2224/11825; H01L 2224/1146; H01L 2224/11464
See application file for complete search history.

(56) References Cited

U.S. PATENT DOCUMENTS

2009/0057690 A1    3/2009  Chakraborty
2010/0190280 A1    7/2010  Horiuchi
(Continued)

FOREIGN PATENT DOCUMENTS

JP    2002-241586    8/2002
JP    2005-079550    3/2005
(Continued)

OTHER PUBLICATIONS

Written Opinion issued on Feb. 24, 2012 in PCT/KR2011/004776.
(Continued)

*Primary Examiner* — Daniel Luke
(74) *Attorney, Agent, or Firm* — H.C. Park & Associates, PLC

(57) ABSTRACT

A semiconductor device including a first lead electrode and a second lead electrode; a semiconductor stack structure disposed on the member, the semiconductor stack structure including a first conductive semiconductor layer, a second conductive semiconductor layer, and an active region interposed between the first and second conductive semiconductor layers; a first electrode electrically connected to the first conductive semiconductor layer; a second electrode electrically connected to the second conductive semiconductor layer; a plating layer configured to bond the semiconductor stack structure to the member; and a first wavelength converter that covers at least side surfaces of the semiconductor stack structure.

11 Claims, 16 Drawing Sheets

(51) Int. Cl.
*H01L 23/498* (2006.01)
*H01L 33/36* (2010.01)
*H01L 33/44* (2010.01)
*H01L 33/00* (2010.01)
*H01L 33/48* (2010.01)

(52) U.S. Cl.
CPC .............. *H01L 24/16* (2013.01); *H01L 24/27* (2013.01); *H01L 24/32* (2013.01); *H01L 24/83* (2013.01); *H01L 24/94* (2013.01); *H01L 33/005* (2013.01); *H01L 33/0095* (2013.01); *H01L 33/36* (2013.01); *H01L 33/44* (2013.01); *H01L 33/50* (2013.01); *H01L 24/05* (2013.01); *H01L 24/06* (2013.01); *H01L 24/33* (2013.01); *H01L 33/0079* (2013.01); *H01L 33/486* (2013.01); *H01L 2224/04026* (2013.01); *H01L 2224/05073* (2013.01); *H01L 2224/05124* (2013.01); *H01L 2224/05144* (2013.01); *H01L 2224/05147* (2013.01); *H01L 2224/05155* (2013.01); *H01L 2224/05171* (2013.01); *H01L 2224/05553* (2013.01); *H01L 2224/05571* (2013.01); *H01L 2224/06151* (2013.01); *H01L 2224/11462* (2013.01); *H01L 2224/16013* (2013.01); *H01L 2224/16057* (2013.01); *H01L 2224/16151* (2013.01); *H01L 2224/27462* (2013.01); *H01L 2224/325* (2013.01); *H01L 2224/32238* (2013.01); *H01L 2224/33151* (2013.01); *H01L 2224/81893* (2013.01); *H01L 2224/83447* (2013.01); *H01L 2224/83455* (2013.01); *H01L 2224/83893* (2013.01); *H01L 2224/94* (2013.01); *H01L 2224/97* (2013.01); *H01L 2924/01029* (2013.01); *H01L 2924/12041* (2013.01); *H01L 2924/12042* (2013.01); *H01L 2924/15787* (2013.01); *H01L 2933/0033* (2013.01)

(56) References Cited

U.S. PATENT DOCUMENTS

2010/0203658 A1* 8/2010 Aida ...................... H01L 33/52 438/27
2010/0258830 A1   10/2010 Ide et al.

FOREIGN PATENT DOCUMENTS

| JP | 2010-103186 | 5/2010 |
| KR | 10-2006-0095271 | 8/2006 |
| KR | 10-2010-0004889 | 1/2010 |
| KR | 10-1230622 | 2/2013 |

OTHER PUBLICATIONS

International Search Report issued on Feb. 24, 2012 in PCT/KR2011/004776.
Korean Office Action issued on Feb. 28, 2012, in KR Patent Application No. 10-2010-0126218.
Non Final Office Action issued on Oct. 2, 2014, in U.S. Appl. No. 13/992,941.
Notice of Allowance issued on Feb. 4, 2015, in U.S. Appl. No. 13/992,941.
Korean Notice of Decision of Rejection issued on Sep. 20, 2012, in KR Patent Application No. 10-2010-0126218.

* cited by examiner

METHOD OF FABRICATING SEMICONDUCTOR DEVICE USING GANG BONDING AND SEMICONDUCTOR DEVICE FABRICATED BY THE SAME

CROSS-REFERENCE TO RELATED APPLICATIONS

This is a Continuation of U.S. patent application Ser. No. 13/992,941, filed on Jun. 10, 2013, now issued as U.S. Pat. No. 9,054,231, which is the National Stage entry of International Application PCT/KR2011/004776, filed on Jun. 30, 2011, and claims priority from and the benefit of Korean Patent Application No. 10-2010-0126218, filed on Dec. 10, 2010, which are incorporated herein by reference for all purposes as if fully set forth herein.

BACKGROUND

Field

The present invention relates to a method of fabricating a semiconductor device and a semiconductor device, and more particularly, to a method of fabricating a semiconductor device using gang bonding and a semiconductor device fabricated by the same.

Discussion of the Background

Light emitting diodes (LEDs) can be made light in weight, thin in thickness and small in size, and have advantages of energy saving and long lifespan. Accordingly, the LEDs are used as backlight sources for various types of display devices including cellular phones, and the like. Since an LED package having an LED mounted thereon can implement white light having a high color rendering property, it is applied to general illumination substituting for white light sources such as fluorescent lamps.

Meanwhile, there are various methods of implementing white light using LEDs, and a method of implementing white light by combining an InGaN LED that emits blue light of 430 to 470 nm with a phosphor that can convert the blue light into light with a long wavelength is generally used. For example, the white light may be implemented by combining a blue LED with a yellow phosphor excited by the blue LED so as to emit yellow light or by combining a blue LED with green and red phosphors.

The LED is generally fabricated using a 2-inch sapphire substrate. GaN-based epitaxial layers are grown on a sapphire substrate, and a plurality of light emitting structures are formed by pattering the grown epitaxial layers. Then, electrode pads are formed on each of the light emitting structures. The plurality of light emitting structures are attached to a blue tape together with the sapphire substrate and then divided into individual LED chips through a scribing and breaking process. The plurality of light emitting structures formed on the same sapphire substrate are classified into superior and inferior LED chips through electrical and optical performance tests, and the LED chips are aligned on an temporary carrier by each classified group.

Meanwhile, the LED chips on the temporary carrier are individually mounted on a printed circuit board (PCB) or a lead frame. At this time, electrode pads of the individual LED chip are electrically connected to corresponding lead terminals of the PCB or the lead frame through bonding wires, respectively. Subsequently, the LED chips are covered with a resin containing phosphor and then divided into individual packages through sawing or the like. The electrical and optical performance tests are performed on the divided LED packages, thereby selecting superior LED packages. Meanwhile, in a case where an LED chip is covered with a resin containing phosphor at a package level, the phosphor is not uniformly dispersed into the resin, and further, it is difficult to uniformly form the resin. Hence, a technique has been developed in which a wavelength conversion layer is uniformly coated or a wavelength conversion sheet containing phosphor is attached at a wafer level before a sapphire substrate is divided.

SUMMARY

However, in the conventional technique, a plurality of LED chips are individually bonded to a PCB, and bonding wires are formed again. Hence, a process of fabricating LED packages is complicated, and it takes much time to fabricate the LED packages. Recently, as the size of a growth substrate has been increased to 4 inches, further 6 inches, from 2 inches, the number of LED chips formed on one growth substrate reaches a few thousands or a few tens of thousands. Therefore, it is required to rapidly fabricate LED packages on a large scale using such LED chips. Further, a wire bonding process using a capillary requires a space for moving the capillary, and hence the space acts as a limitation in miniaturizing the LED packages. Furthermore, failure of the LED packages is easily caused by bonding failure of wires, disconnection, or the like.

Accordingly, the present invention is conceived to solve the aforementioned problems. An object of the present invention is to provide a method of fabricating a semiconductor device, which is suitable for mass production by simplifying processes.

Another object of the present invention is to provide a semiconductor device and a method of fabricating the same, which can achieve a stable electrical connection between electrode pads and lead terminals in a semiconductor chip such as a light emitting diode (LED) chip.

A further object of the present invention is to provide a semiconductor device and a method of fabricating the same, suitable for miniaturization.

A still further object of the present invention is to provide an LED package and a method of fabricating the same, suitable for implementing mixed-color light, particularly white light.

According to an aspect of the present invention, there is provided a method of fabricating a semiconductor device comprising the step of preparing a support substrate having a plurality of semiconductor stack structures aligned on a top thereof. Each of the semiconductor stack structures comprises a first conductive semiconductor layer, a second conductive semiconductor layer and an active region interposed between the first and second conductive semiconductor layers. A member having first lead electrodes and second lead electrodes is prepared to correspond to the plurality of semiconductor stack structures. Then, the plurality of semiconductor stack structures are bonded to the member while maintaining the plurality of semiconductor stack structures on the support substrate. After the plurality of semiconductor stack structures are bonded to the member, the member is divided.

Accordingly, since a plurality of semiconductor stack structures are gang-bonded to a member such as a printed circuit board or a lead frame, it is possible to simplify a semiconductor chip bonding process and considerably reduce working time. Particularly, the semiconductor device may be a light emitting diode (LED) package, and the member may be a packaging member.

Although the plurality of semiconductor stack structures may be bonded to the member using solder bonding, they may be bonded to the member at a low temperature of about 100° C. or lower using a plating bonding technique, e.g., an electroplating bonding technique or a conductive adhesive. Accordingly, it is possible to reduce thermal budget as compared with the solder bonding, thereby preventing electrical or optical characteristic deterioration of a semiconductor chip due to the bonding process.

By bonding the plurality of semiconductor stack structures to the member, the first and second conductive semiconductor layers of each of the semiconductor stack structures can be electrically connected to the first and second lead electrodes, respectively. Accordingly, a wire bonding process can be omitted, and thus the fabricating process can be more simplified.

The method may further comprise the step of forming first and second electrodes electrically connected to the first and second conductive semiconductor layers of each of the semiconductor stack structures, respectively. The first and second electrodes may be bonded to the first and second lead electrodes, respectively. Each of the first and second electrodes may comprise an electrode pad and an additional electrode, but is not particularly limited.

In some embodiments, the member may further comprise spacer electrodes respectively formed on the first and second lead electrodes. The spacer electrodes may be used to allow the semiconductor stack structures to be spaced apart from the member. The first and second electrodes may be bonded to the spacer electrodes respectively using an electroplating bonding technique.

The first lead electrodes may be electrically connected to one another, and the second lead electrodes may be electrically connected to one another. Accordingly, a power source for electroplating is connected to the first lead electrodes and the second lead electrodes, so that these lead electrodes can be put in the same negative potential state. Further, the first and second lead electrodes may be electrically connected to each other.

In some embodiments, the first electrodes may be electrically connected to one another on the support substrate, and the second electrodes may be electrically connected to one another on the support substrate. Thus, the power source may be connected to the first electrodes and the second electrodes.

The method may further comprise the step of forming a wavelength converter with a uniform thickness on a top of the semiconductor stack structures facing the member, after the plurality of semiconductor stack structures are bonded to the member. The wavelength converter may be formed on a growth substrate or formed to come in contact with the first conductive semiconductor layer.

In some embodiments, the support substrate may be a growth substrate. When the member is divided, the growth substrate may be divided together with the member. Alternatively, the growth substrate may be removed from the plurality of semiconductor stack structures before the member is divided.

In some embodiments, the step of preparing the support substrate may comprise the step of forming another wavelength converter that covers at least side surfaces of the plurality of semiconductor stack structures.

Alternatively, the method may further comprise the step of forming a resin molding portion that fills in a space between the support substrate and the member after the plurality of semiconductor stack structures are bonded to the member. The resin molding portion may contain a phosphor. The wavelength converter with a uniform thickness may be formed together with the resin molding portion.

In some embodiments, the support substrate may be a carrier substrate having a plurality of semiconductor stack structures bonded thereto, and each of the semiconductor chips may comprise the semiconductor stack structure. The semiconductor chip may be an LED chip, but the present invention is not limited thereto.

Each of the LED chips may further comprise a wavelength converter that covers at least side surfaces of the semiconductor stack structures. Alternatively, after the semiconductor stack structures are bonded to the member, the carrier substrate may be removed, and a wavelength converter that fills in a space among the plurality of semiconductor stack structures may be formed. The wavelength converter with a uniform thickness may be formed together with the wavelength converter that fills in the space among the plurality of semiconductor stack structures.

The member may not be particularly limited as long as it has the lead electrodes arranged thereon. The member may be a packaging member capable of finally providing a package body, e.g., a printed circuit board (PCB) or a lead frame, such as a FR4-PCB, a metal-PCB, a metal core PCB or a ceramic substrate.

According to another aspect of the present invention, there is provided a semiconductor device comprising: a member having a first lead electrode and a second lead electrode; a semiconductor stack structure positioned on the member, the semiconductor stack structure having a first conductive semiconductor layer, a second conductive semiconductor layer and an active region interposed between the first and second conductive semiconductor layers; and a plating layer that bonds the semiconductor stack structure to the member. The plating layer may be an electroplating layer formed using an electroplating bonding technique. Since the semiconductor stack structure is bonded to the member by the electroplating layer, it is possible to simultaneously bond a plurality of semiconductor stack structures to the member, thereby fabricating semiconductor devices in large quantities.

The semiconductor device may further comprise a first electrode electrically connected to the first conductive semiconductor layer; and a second electrode electrically connected to the second conductive semiconductor layer. The plating layer may comprise a first plating layer for bonding the first electrode to the first lead electrode and a second plating layer for bonding the second electrode to the second lead electrode.

The semiconductor device may further comprise spacer electrodes respectively positioned on the first and second lead electrodes. The first and second plating layers may bond the first and second electrodes to the spacer electrodes, respectively.

The semiconductor device may further comprise a first wavelength converter that covers at least side surfaces of the semiconductor stack structure and/or a second wavelength converter with a uniform thickness positioned on a top of the semiconductor stack structure to be opposite to the member. Thus, mixed-color light, e.g., white light can be implemented by converting the wavelength of light emitted from the semiconductor stack structure.

The first wavelength converter may be extended to a space between the semiconductor stack structure and the member so as to cover the semiconductor stack structure. Thus, the wavelength conversion can be performed on light emitted from the semiconductor stack structure to the member.

The semiconductor device may further comprise a growth substrate positioned on the semiconductor stack structure to be opposite to the member. The second wavelength converter may be positioned on the growth substrate. The first and second wavelength converters may be spaced apart from each other by the growth substrate.

In a specific embodiment, the growth substrate has an area substantially identical to that of the member and may be positioned on the member. Thus, the semiconductor device can be provided to have a size that does not exceed the area of the LED chip.

According to a further aspect of the present invention, there is provided a semiconductor device comprising: a member having a first lead electrode and a second lead electrode; a semiconductor stack structure positioned on the member, the semiconductor stack structure having a first conductive semiconductor layer, a second conductive semiconductor layer and an active region interposed between the first and second conductive semiconductor layers; a first electrode electrically connected to the first conductive semiconductor layer; a second electrode electrically connected to the second conductive semiconductor layer; a first conductive adhesive for bonding the first electrode to the first lead electrode; and a second conductive adhesive for bonding the second electrode to the second lead electrode. Since the semiconductor stack structure is bonded to the member using the conductive adhesive, it is possible to remove bonding wires.

The first and second conductive adhesives may be, for example, silver paste.

According to the present invention, since a plurality of semiconductor stack structures are gang-bonded to a member such as a printed circuit board or a lead frame, it is possible to simplify a semiconductor chip bonding process and considerably reduce working time. Further, since the plurality of semiconductor stack structures can be electrically connected to lead electrodes in the gang bonding process, it is unnecessary to bond wires, and thus it is possible to prevent a packaging failure due to disconnection of wire, or the like. Furthermore, the plurality of semiconductor stack structures are bonded to a mounting member such as a packaging member by using an electroplating bonding technique or by using a conductive adhesive, so that it is possible to reduce thermal budget in a process of fabricating a semiconductor device.

In addition, since a final semiconductor device can be fabricated by dividing the member together with a growth substrate, the semiconductor device can be minimized to the size of a light emitting diode chip.

Moreover, since wavelength conversion can be performed on light emitted not only from a top surface of the semiconductor stack structure, but also from side and bottom surfaces of the semiconductor stack structure, it is possible to provide a semiconductor device suitable for implementing mixed-color light, particularly white light.

DETAILED DESCRIPTION OF THE ILLUSTRATED EMBODIMENTS

Figure 1A:
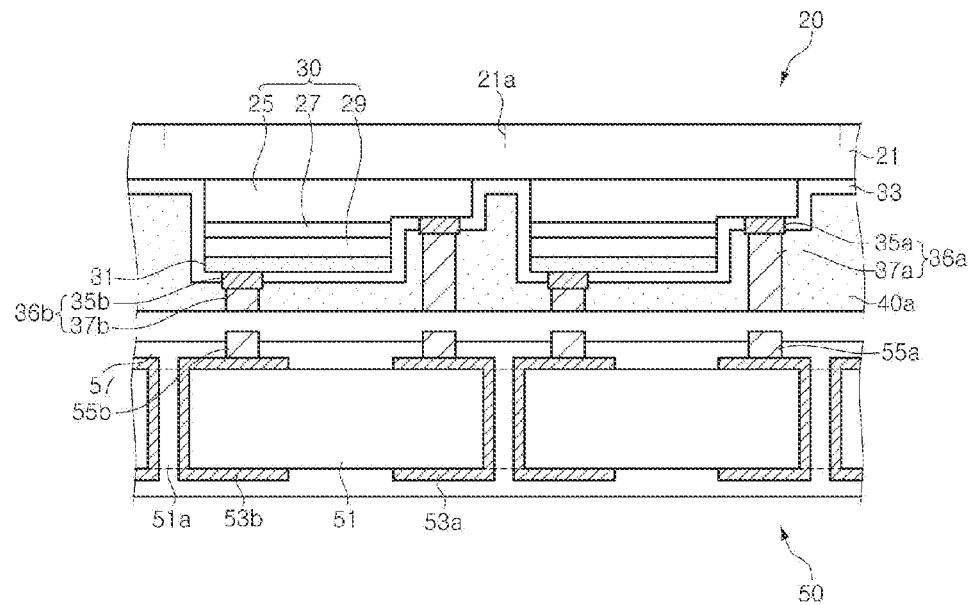
FIGS. 1a to 1d are sectional views illustrating a method of fabricating a light emitting diode (LED) package according to a first embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

In the following embodiments, a method for fabricating a light emitting diode (LED) package is mainly described, but the present invention is not limited thereto and may be applied to a method for fabricating a different kind of semiconductor device.

FIGS. 1a to 1d are sectional views illustrating a method of fabricating an LED package according to a first embodiment of the present invention.

Figure 1B:
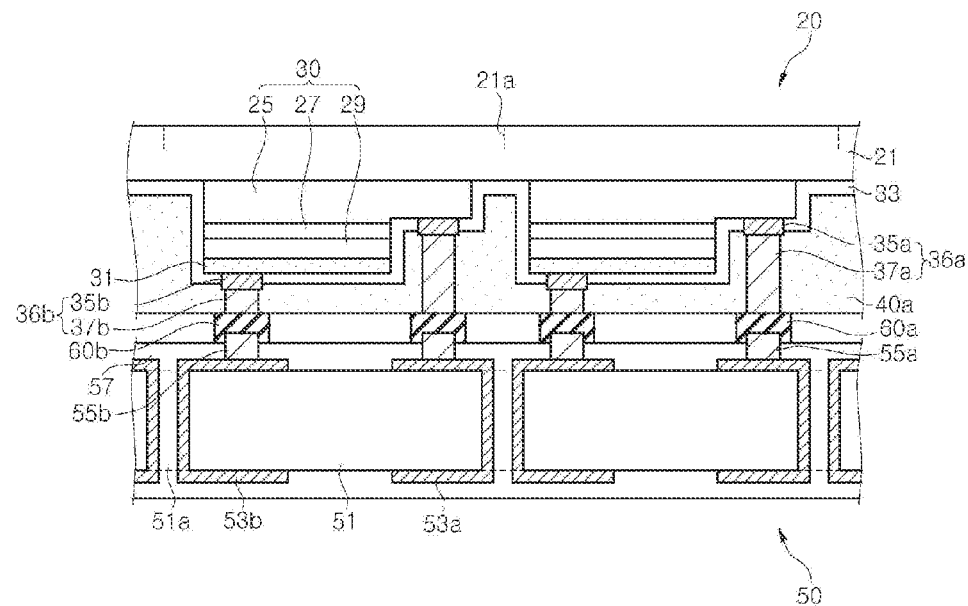
Figure 1C:
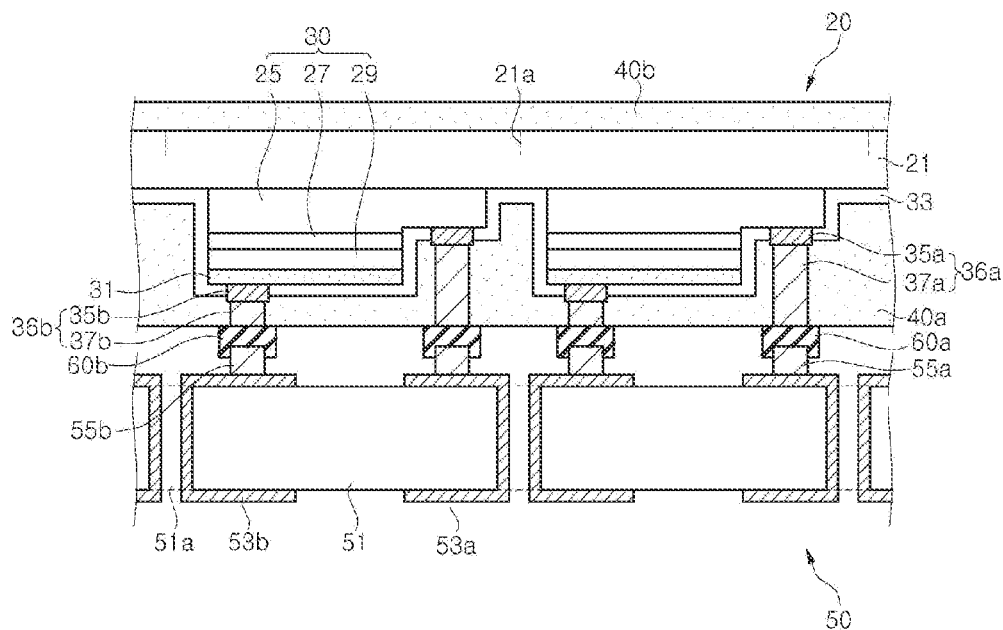
Figure 1D:
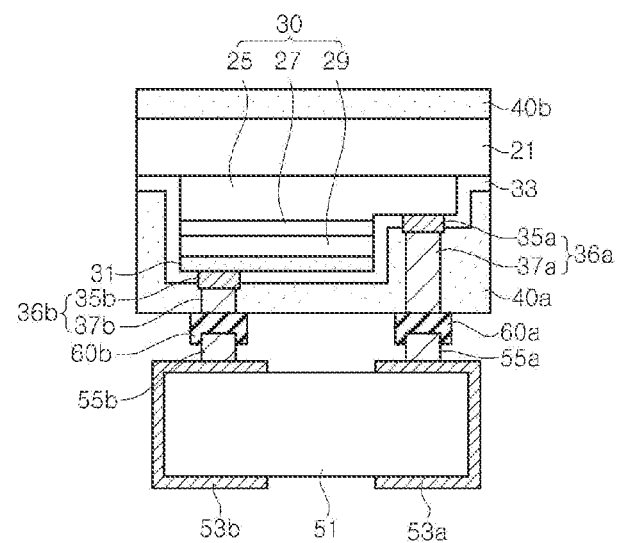

Referring to FIG. 1d, there is provided a substrate assembly 20 in which a plurality of semiconductor stack structures 30 are arrayed on a substrate 21, and there is a packaging member 50 having lead electrodes 53a and 53b.

(Preparation of Substrate Assembly 20)

The substrate assembly 20 may comprise a substrate 21, semiconductor stack structures 30, a first electrode 36a, a second electrode 36b and a first wavelength converter 40a. Each of the semiconductor stack structures may comprise a first conductive semiconductor layer 25, an active layer 27 and a second conductive semiconductor layer 29. The first electrode 36a may comprise a first electrode pad 35a and a first additional electrode 37a, and the second electrode 36b may comprise a second electrode pad 35b and a second additional electrode 37b.

The substrate assembly 20 may comprise an ohmic contact layer 31, and a buffer layer (not shown) may be interposed between the first conductive semiconductor layer 25 and the substrate 21.

The substrate 21 may be a growth substrate such as sapphire, silicon carbide or spinel, on which a nitride semiconductor layer can be grown.

The semiconductor stack structures may be fabricated by an ordinary process of fabricating an LED chip. That is, the plurality of the semiconductor stack structures are formed on the substrate 21 by growing epitaxial layers comprising the first conductive semiconductor layer 25, the active layer 27 and the second conductive semiconductor layer 29 on the substrate 21 and then patterning these epitaxial layers. Portions of the second conductive semiconductor layer 29 and the active layer 27 may also be removed to expose a partial region of the first conductive semiconductor layer 25.

The active layer 27 and the first and second conductive semiconductor layers 25 and 29 may be formed of a III-N-based compound semiconductor, e.g., an (Al, Ga, In)N semiconductor. Each of the first and second conductive semiconductor layers 25 and 29 may have a single- or multi-layered structure. For example, the first conductive semiconductor layer 25 and/or the second conductive semiconductor layer 29 may include a contact layer and a clad layer, and may further include a superlattice layer. In addition, the active layer 27 may have a single or multiple quantum well structure. For example, the first and second conductive semiconductor layers may be n-type and p-type semiconductor layers, respectively, but the present invention is not limited thereto, and the opposite may be possible. The buffer layer 23 reduces lattice mismatch between the substrate 21 and the first conductive semiconductor layer 25, thereby reducing the defect density generated in the semiconductor layers 25, 27 and 29.

Meanwhile, the ohmic contact layer 31 may be formed on the second conductive semiconductor layer 29, and the first and second electrode pads 35a and 35b may be formed on the first and second conductive semiconductor layers 25 and 29, respectively. Although the ohmic contact layer 31 may be formed of, for example, a transparent conductive layer such as Ni/Au, ITO, IZO, ZnO, the present invention is not limited thereto. The first and second electrode pads 35a and 35b may include, for example, Ti, Cu, Ni, Al, Au or Cr, and may be formed of two or more materials among them. The second electrode pad 35b may electrically come in contact with the second conductive semiconductor layer 29 through the ohmic contact layer. An insulating layer 33 that covers the semiconductor stack structures 30 may also be formed before the electrode pads 35a and 35b are formed. The insulating layer 33 may be formed of, for example, a silicon oxide or silicon nitride.

The first and second additional electrodes 37a and 37b may be further formed on the first and second electrode pads 35a and 35b, respectively. When the first wavelength converter 40a is formed, the first and second additional electrodes 37a and 37b provide electrical contact point portions to the outside of the first wavelength converter 40a. The first and second additional electrodes 37a and 37b may have widths narrower than those of the first and second electrode pads 35a and 35b, respectively.

Meanwhile, the first wavelength converter 40a is formed on the substrate 21 having the semiconductor stack structures 30 formed thereon. The first wavelength converter 40a may be formed using a screen printing technique using squeeze. Accordingly, the first wavelength converter 40a can be formed to cover side and top surfaces of the semiconductor stack structures 30. The first wavelength converter 40a may be formed using epoxy or silicone containing a phosphor. Alternatively, the first wavelength converter 40a may be formed by attaching a wavelength conversion sheet to the second conductive semiconductor layer 29. The additional electrodes 37a and 37b may be exposed to the outside passing through the first wavelength converter 40a. As shown in these figures, the top surface of the first additional electrode 37a may be positioned at the same height as that of the second additional electrode 37b, and may be parallel to the surface of the first wavelength converter 40a. However, the present invention is not limited thereto. That is, the top surfaces of the first and second additional electrodes 37a and 37b may be protruded through the surface of the first wavelength converter 40a, or may be positioned inside the surface of the first wavelength converter.

Meanwhile, the thickness of the growth substrate 21 may be decreased through backside grinding, and scribing grooves 21a may be formed in the growth substrate through a scribing process. The scribing grooves 21a may be formed on a back or front side of the substrate 21. In a case where the scribing grooves 21a are formed on the front side of the substrate 21, the first wavelength converter 40a may be divided into individual semiconductor stack structures 30 by the scribing grooves.

(Preparation of Packaging Member 50)

A printed circuit board (PCB) 50 having the lead electrodes 53a and 53b printed thereon may be used as the packaging member 50. For example, the PCB may include various general PCBs such as a FR4-PCB, a metal-PCB, a metal core PCB and a ceramic substrate.

The PCB 50 has a substrate 51 and the lead electrodes 53a and 53b printed on the substrate 51. In a case where the substrate 51 is a conductive substrate such as a metal PCB, the lead electrodes 53a and 53b may be insulated from the conductive substrate by an insulating layer (not shown).

The lead electrodes 53a and 53b may have internal terminals formed on the top of the substrate 51, and may have external terminals connected to an external power source at the bottom of the substrate. These terminals are connected through conductive traces.

The substrate 51 may have through-holes 51a formed in a line shape along substrate surfaces, and the traces may connect the internal and external terminals through the through-holes 51a. However, the through-holes 51a of line shapes are not essential, and the trace may connect the internal and external terminals through a cylindrical through-hole.

Meanwhile, first and second spacer electrodes 55a and 55b may be formed on the lead electrodes 53a and 53b. The spacer electrodes 55a and 55b may be formed by performing plating with nickel, copper or the like. The spacer electrodes 55a and 55b are protruded from the lead electrodes 53a and 53b, respectively.

(Bonding Process)

As shown in FIG. 1a, to perform electroplating, the lead electrodes 53a and 53b are coated with an anti-plating layer 57, and the spacer electrodes 55a and 55b are exposed to the outside of the anti-plating layer. The anti-plating layer 57 may be formed of photoresist, photosensitive resin, polyimide or the like.

The first and second spacer electrodes 55a and 55b are disposed close to the first and second electrodes 36a and 36b, respectively. In order to provide a path through which ions in a plating bath can move, the substrate assembly 20 and the PCB 50 are disposed so that a space is formed between the first wavelength converter 40a and the anti-plating layer 57. At this time, the first and second spacer electrodes 55a and 55b may come in contact with first and second electrodes 36a and 36b, respectively.

Figure 2A:
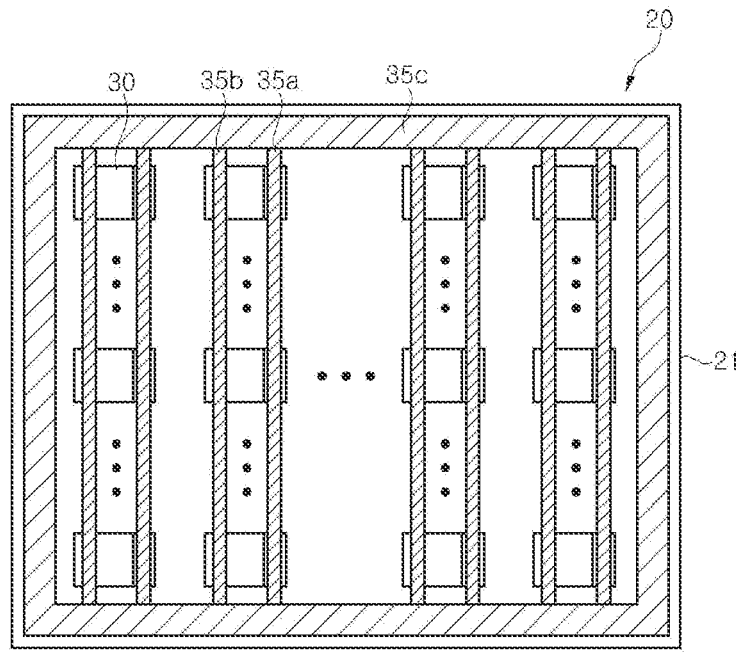
FIGS. 2a and 2b show examples of a support substrate and a printed circuit board, to which an electroplating bonding technique is applied according to the first embodiment of the present invention, respectively.
Figure 2B:
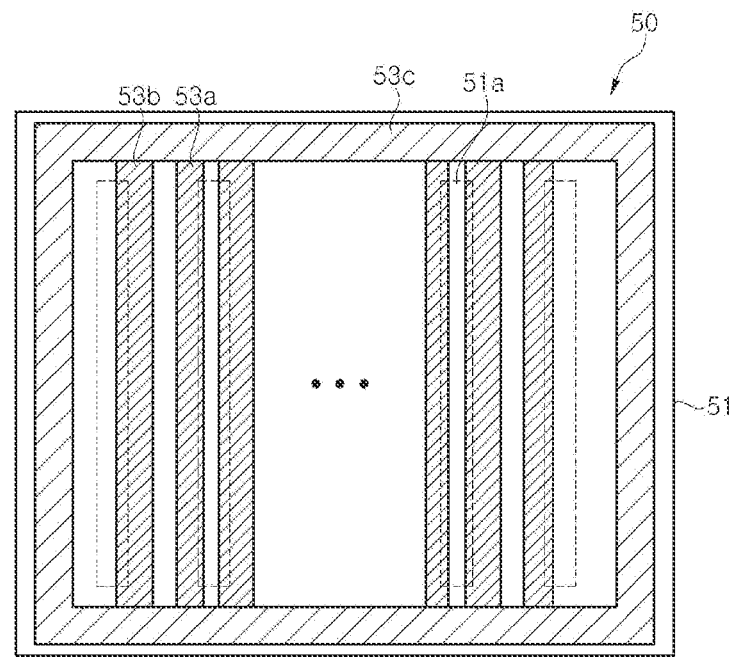
Figure 2C:
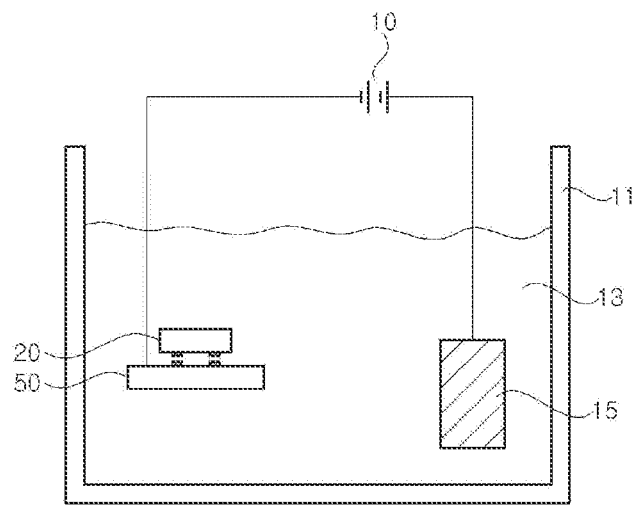
FIG. 2c schematically shows a plating bath for performing an electroplating bonding process according to the first embodiment of the present invention.

Referring to FIG. 1b, an electroplating process is performed by positioning the substrate assembly 20 and/or the PCB 50 in a plating bath (11 of FIG. 2c). As shown in FIG. 2c, the substrate assembly 20 and the PCB 50 may be immersed in a solution 13 contained in the plating bath 11. Meanwhile, a positive electrode of a DC power source 10 is connected to a metal plate 15 for plating, and a negative electrode of the DC power source 10 is connected to the substrate assembly 20 and/or the PCB 50. Accordingly, a negative voltage is applied to the first and second lead electrodes 53a and 53b and/or the first and second electrodes 36a and 36b so that plating layers 60a and 60b are formed between the exposed electrodes 36a and 36b and the spacer electrodes 55a and 55b, respectively. The electroplating may be performed, for example, in a nickel plating bath at a temperature of 100° C. or lower, e.g., about 50° C. The electroplating may also be performed in a copper or silver plating bath other than in the nickel plating bath.

The plurality of semiconductor stack structures 30 are bonded and electrically connected to the PCB 50 by the plating layers 60a and 60b.

(Formation of Second Wavelength Converter 40b)

Referring to FIG. 1c, after the bonding process is completed, the anti-plating layer 57 is removed, and a second wavelength converter 40b is formed on the growth substrate 21. The anti-plating layer 57 may be selectively removed using acetone or the like. Meanwhile, the second wavelength converter 40b may be formed by coating a phosphor or by coating a resin containing a phosphor. Alternatively, the second wavelength converter may be formed by attaching a wavelength conversion sheet containing a phosphor, e.g., a glass sheet on the growth substrate 21.

(Division Process)

The substrate 21 and the PCB 50 are divided together so that an LED package is completed as shown in FIG. 1d. The substrate 21 and the PCB 50 may be divided by scribing and breaking, sawing, or the like.

Referring to FIG. 1d, in the LED package, the final area of the growth substrate 21 is almost identical to that of the PCB 50. In a case where the through-holes 51a are previously formed in the PCB 50, the final area of the growth substrate 21 may be larger than that of the PCB 50.

In the LED package according to this embodiment, the second wavelength converter 40b formed on the backside of the growth substrate 21 and the first wavelength converter 40a that covers the semiconductor stack structure 30 are disposed to be spaced apart from each other, and side surfaces of the first wavelength converter 40a, the growth substrate 21 and the second wavelength converter 40b are formed in parallel to one another.

Although it has been described in this embodiment that the second wavelength converter 40b is formed after the bonding process, the present invention is not limited thereto. That is, the second wavelength converter may be formed before the bonding process is performed.

In this embodiment, the first and second lead electrodes 53a and 53b and/or the first and second electrodes 36a and 36b are put in the same negative potential state in the electroplating process. This will be described with reference to FIGS. 2a and 2b.

FIGS. 2a and 2b show examples of a support substrate and a printed circuit board, to which an electroplating bonding technique is applied according to the first embodiment of the present invention, respectively.

Referring to FIG. 2a, the semiconductor stack structures 30 are aligned on the support substrate 21, and the first or second electrode pads 35a or 35b on the semiconductor stack structures 30 are extended and connected to each other. Side surfaces of the semiconductor stack structures 30 can be insulated from the electrode pads 35a and 35b by the insulating layer 33.

Meanwhile, a metal frame layer 35c is formed along the edge of the substrate 21, and the first and second electrode pads 35a and 35b are electrically connected to each other through the metal frame layer 35c.

Although it has been illustrated in FIG. 2a that all of the first and second electrode pads are electrically connected to each other, the first and second electrode pads 35a and 35b may be insulated from each other. In this case, voltages may be applied to the first and second electrode pads 35a and 35b, respectively. Thus, the deposition rate of an electroplating layer can be separately controlled in the first and second electrode pads.

Meanwhile, although it has been illustrated in this figure that the substrate 21 has a quadrangular shape, the shape of the substrate 21 is not limited thereto and may be a circular shape.

Referring to FIG. 2b, a metal frame layer 53c is formed along the edge of the PCB 50, and the first and second lead electrodes 53a and 53b are extended in a line shape and electrically connected to the metal frame layer 53c. A pair of lead electrodes 53a and 53b may be formed between through-holes 51a. As described with reference to FIG. 2a, the first and second lead electrodes 53a and 53b may be electrically connected to each other. However, the first and second electrodes may be insulated from each other.

In a case where the electroplating is performed, a voltage may be applied to any one or both of the substrate assembly 20 and the PCB 50.

FIGS. 3a to 3d are sectional views illustrating a method of fabricating an LED package according to a second embodiment of the present invention.

Figure 3A:
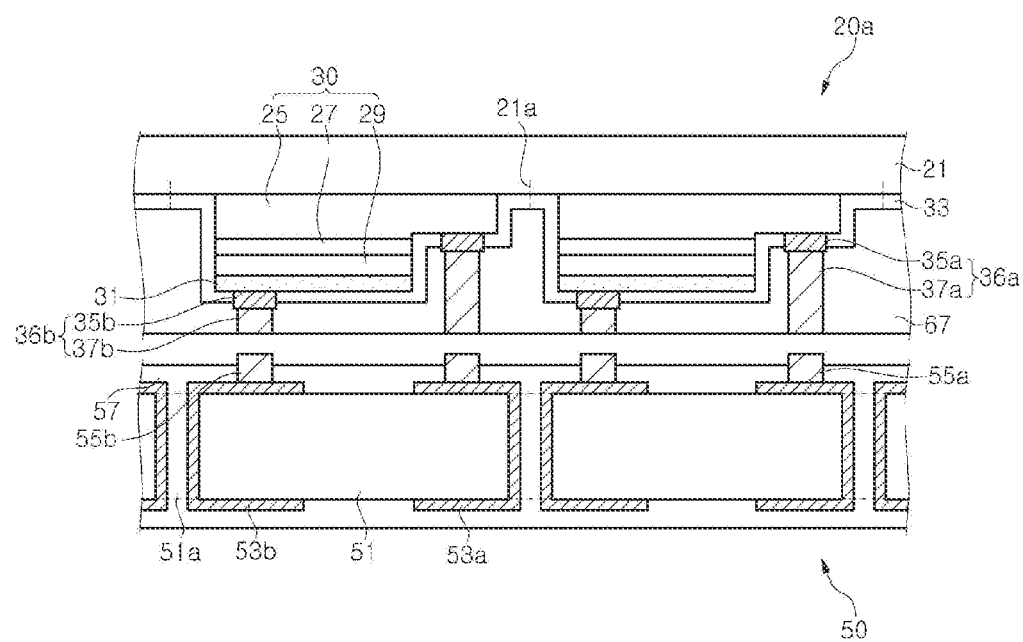
FIGS. 3a to 3d are sectional views illustrating a method of fabricating an LED package according to a second embodiment of the present invention.

Referring to FIG. 3a, a substrate assembly 20a according to this embodiment is different from the substrate assembly 20 of FIG. 1a in that the first wavelength converter 40a is not formed. An anti-plating layer 67 may be formed in place of the first wavelength converter 40a. Like the anti-plating layer 57, the anti-plating layer 67 may be formed of photoresist, polyimide or the like.

Figure 3B:
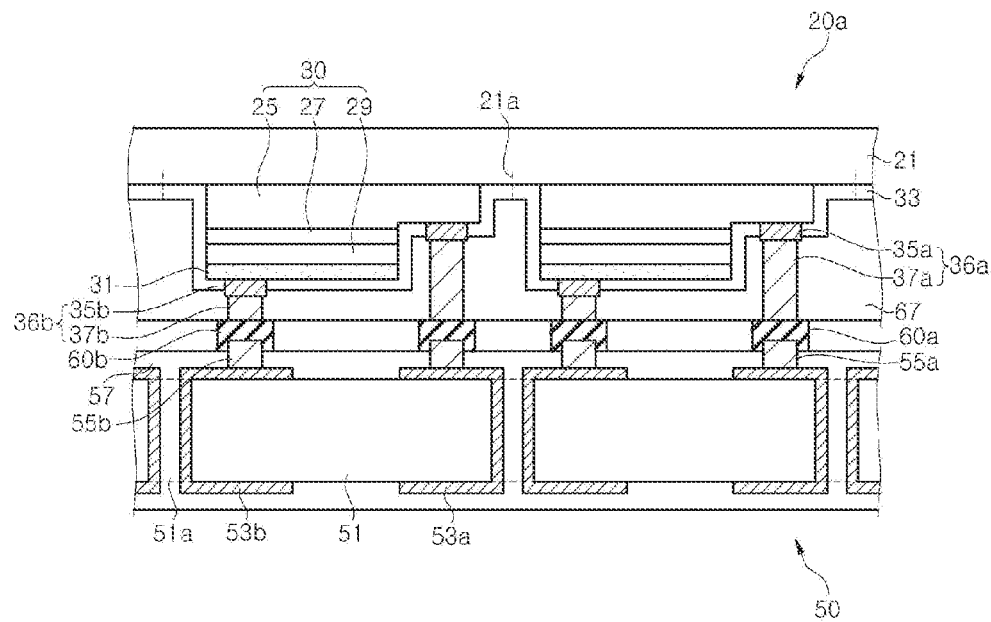

Referring to FIG. 3b, as described with reference to FIG. 1b, a first plating layer 60a is formed between the first electrode 36a and the first spacer electrode 55a, and a second plating layer 60a is formed between the second electrode 36b and the second spacer electrode 55b.

Figure 3C:
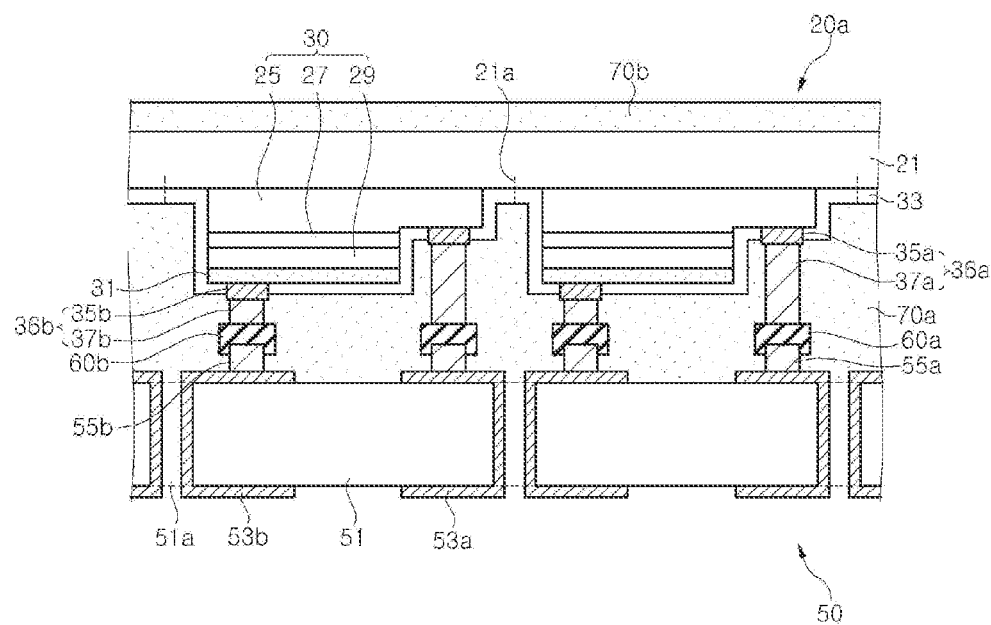

Referring to FIG. 3c, after the plating layers 60a and 60b are formed, the anti-plating layers 57 and 67 are removed using acetone or the like. Then, a first wavelength converter 70a is formed to fill in a space between the growth substrate 21 and the PCB 50, and a second wavelength converter 70b is formed above the substrate 21.

The first wavelength converter 70a may be formed by injecting a resin containing a phosphor, e.g., silicone or epoxy. Meanwhile, the second wavelength converter 70b may be formed using a wavelength conversion layer or wavelength conversion sheet, separately from the first wavelength converter 70a, as described with reference to FIG. 1c. Alternatively, the second wavelength converter 70b may be formed together with the first wavelength converter 70a. For example, in a case where the size of the substrate assembly 20a is smaller than that of the PCB 50, the second wavelength converter may be formed to cover the substrate 21 by injecting the resin containing the phosphor between the substrate 21 and the PCB 50.

Figure 3D:
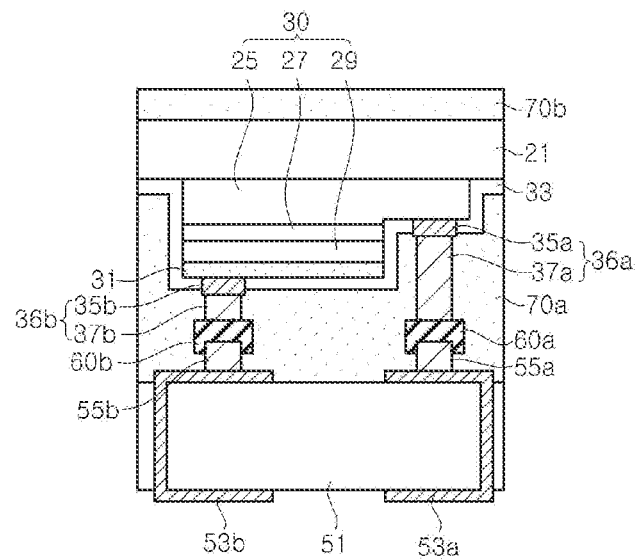

Referring to FIG. 3d, the LED package is completed by dividing the substrate 21 is and the PCB 50 together. Here, the first wavelength converter 70a fills in the space between the substrate 21 and the PCB 50. Thus, the first wavelength converter 70a can stably fix the semiconductor stack structure 30 to the substrate 51.

Figure 4A:
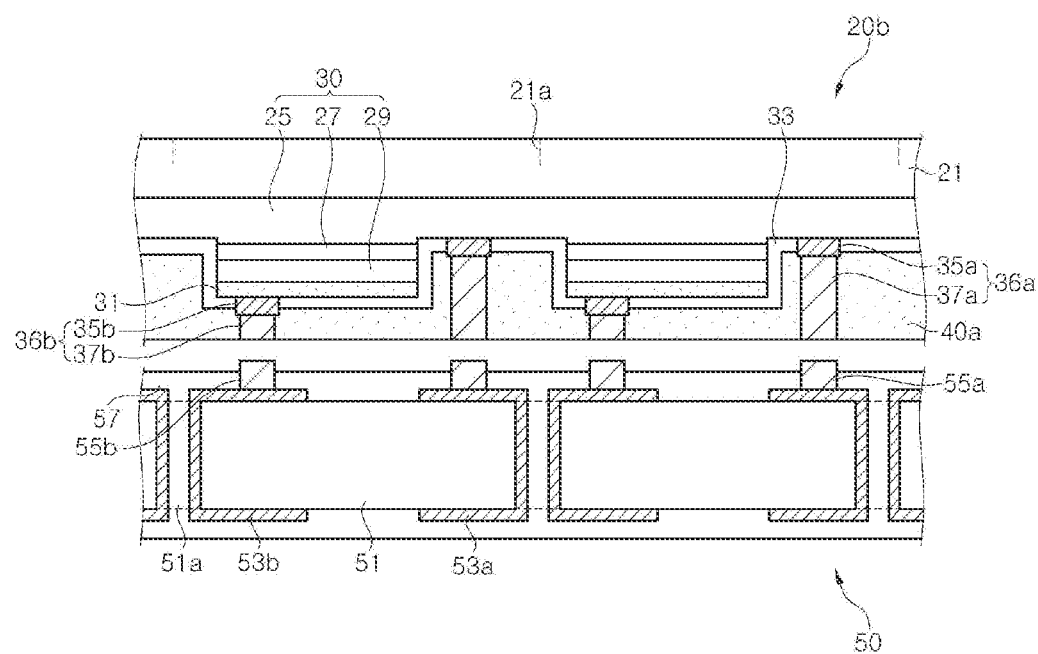
FIGS. 4a and 4b are sectional views illustrating a method of fabricating an LED package according to a third embodiment of the present invention.
Figure 4B:
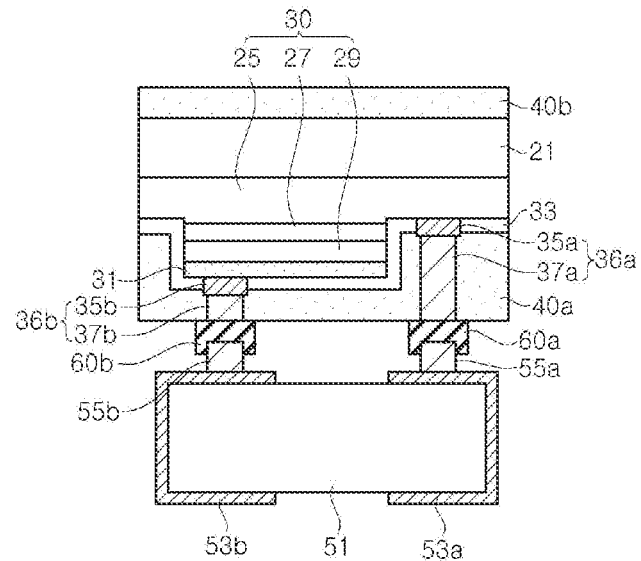

FIGS. 4a and 4b are sectional views illustrating a method of fabricating an LED package according to a third embodiment of the present invention.

Referring to FIG. 4a, a substrate assembly 20b according to this embodiment is almost identical to the substrate assembly 20 described with reference to FIG. 1a, but is different in that the first conductive semiconductor layer 25 is not separated for each of the semiconductor stack structures 30 but continuous. That is, when the epitaxial layers formed on the growth substrate 21 are patterned, some regions of the second conductive semiconductor layer 29 and the active layer 27 are removed, and the first conductive semiconductor layer 25 is partially patterned.

Subsequent processes are performed identically to those described with reference to FIGS. 1a to 1d. Accordingly, when the growth substrate 21 is divided, the first conductive semiconductor layer 25 is divided together with the growth substrate, and thus side surfaces of the growth substrate 21 and the first conductive semiconductor layer 25 are lined up.

Figure 4C:
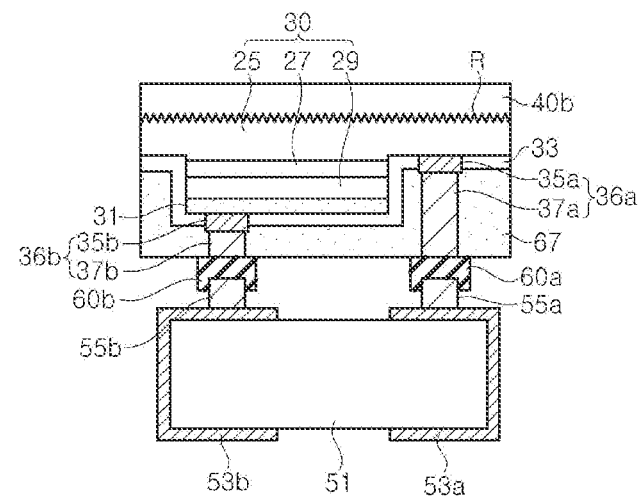
FIG. 4c is a sectional view illustrating a method of fabricating an LED package according to a fourth embodiment of the present invention.

FIG. 4c is a sectional view illustrating a method of fabricating an LED package according to a fourth embodiment of the present invention.

The method of fabricating the LED package according to this embodiment is almost identical to that of fabricating the LED package according to the third embodiment described with reference to FIGS. 4a and 4b, but is different in that the growth substrate 21 is removed. That is, after the substrate assembly 20b is bonded to the PCB 50, the growth substrate 21 is removed, and a surface of the first conductive semiconductor layer 25 is exposed. The growth substrate 21 may be removed by laser lift-off, grinding or etching.

Meanwhile, a roughened surface R may be formed on the exposed surface of the first conductive semiconductor layer 25. The roughened surface R may be formed by wet etching such as photo electro chemical (PEC) etching. Meanwhile, the second wavelength layer 40b is formed on the surface of the first conductive semiconductor layer 25.

The process of removing the growth substrate 21 may be applied to the first embodiment described with reference to FIGS. 1a to 1d and the second embodiment described with reference to FIGS. 3a to 3d.

FIGS. 5a to 5d are sectional views illustrating a method of fabricating an LED package according to a fifth embodiment of the present invention.

Figure 5A:
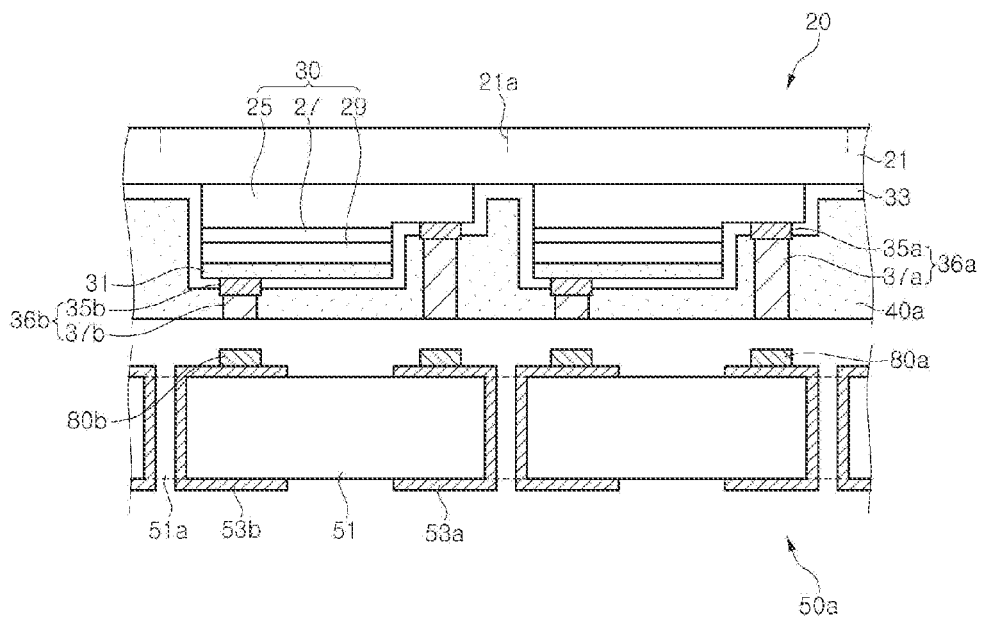
FIGS. 5a to 5d are sectional views illustrating a method of fabricating an LED package according to a fifth embodiment of the present invention.

Referring to FIG. 5a, a substrate assembly 20 according to this embodiment is prepared identically to the substrate assembly 20 of FIG. 1a, but is different in that first and second conductive adhesives 80a and 80b are formed on the lead electrodes 53a and 53b of a PCB 50a, respectively. The spacer electrodes 55a and 55b may be omitted, and the conductive adhesives 80a and 80b may be directly formed on the lead electrodes, respectively.

The conductive adhesives 80a and 80b such as silver paste may be disposed on the respective lead electrodes by coating, screen printing, or the like.

Meanwhile, in this embodiment, the anti-plating layer 57 described with reference to FIG. 1a is omitted.

Figure 5B:
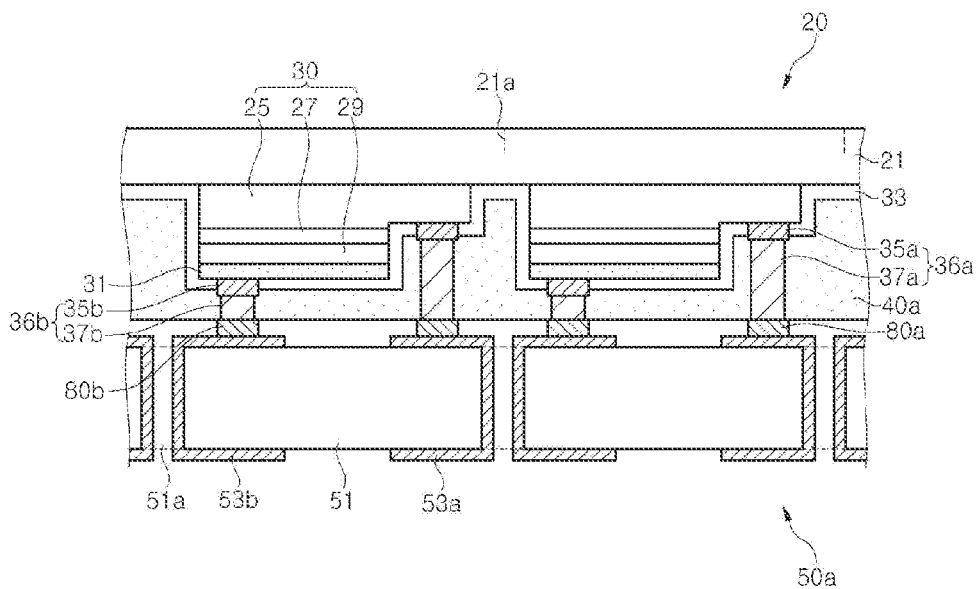

Referring to FIG. 5b, the first and second electrodes 36a and 36b come in contact with the respective corresponding conductive adhesives 80a and 80b, and the conductive adhesives are then cured. The conductive adhesives may be cured at about 100° C. or lower.

Figure 5C:
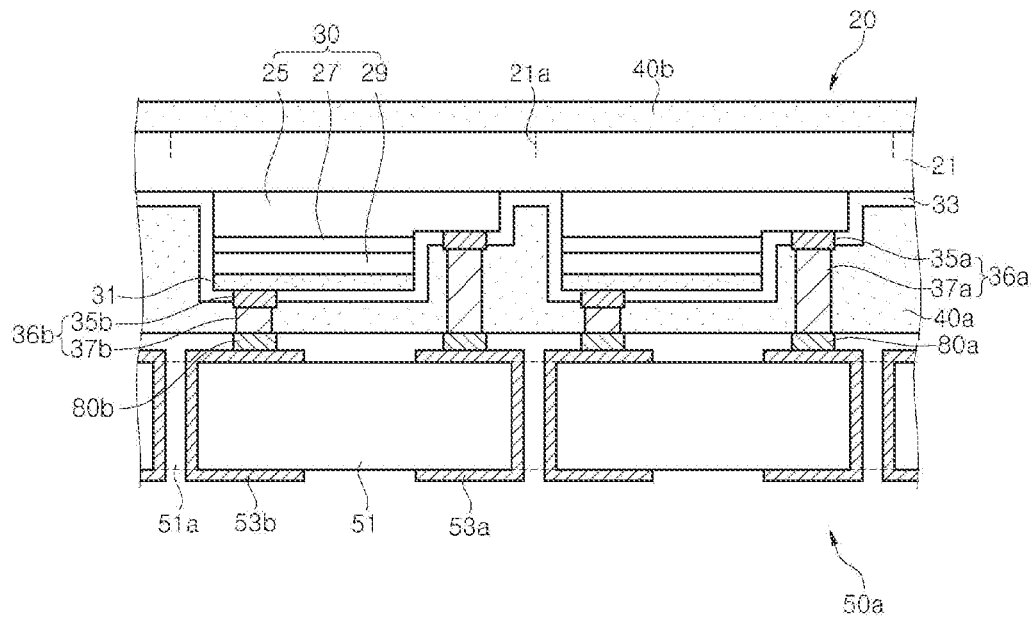

Referring to FIG. 5c, the second wavelength converter 40b is formed on the substrate 21 as described with reference to FIG. 2c. The second wavelength converter 40b may be previously formed before the bonding process using the conductive adhesives.

Figure 5D:
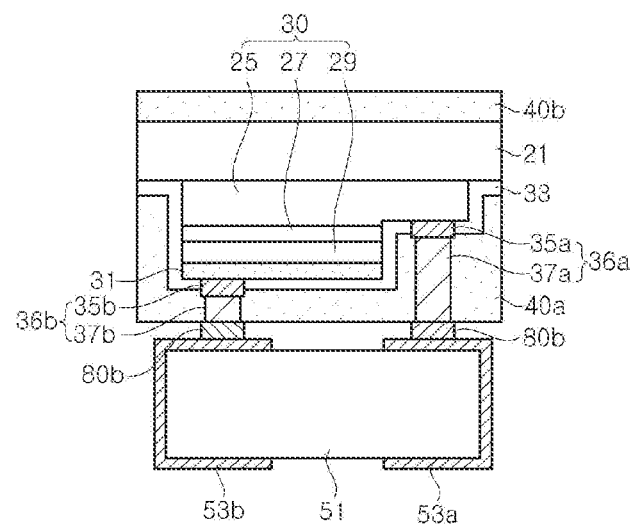

Referring to FIG. 5d, an individual LED package is completed by dividing the substrate 21 and the PCB 50a together.

Figure 6A:
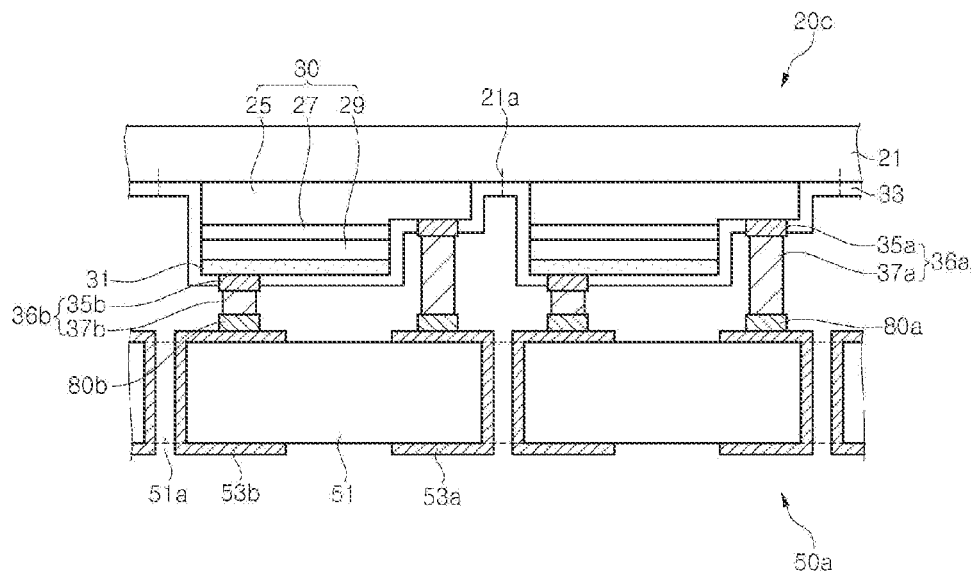
FIGS. 6a to 6c are sectional views illustrating a method of fabricating an LED package according to a sixth embodiment of the present invention.
Figure 6B:
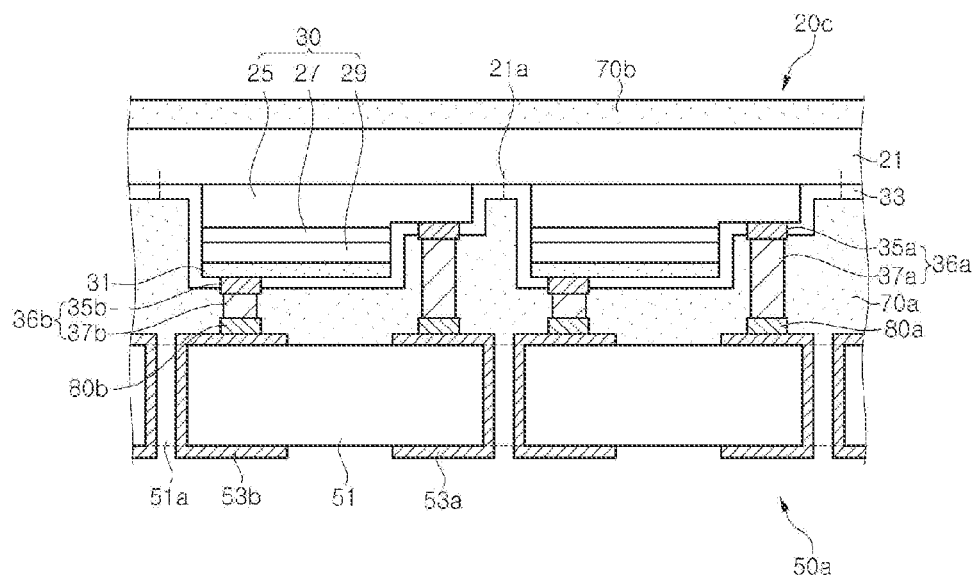
Figure 6C:
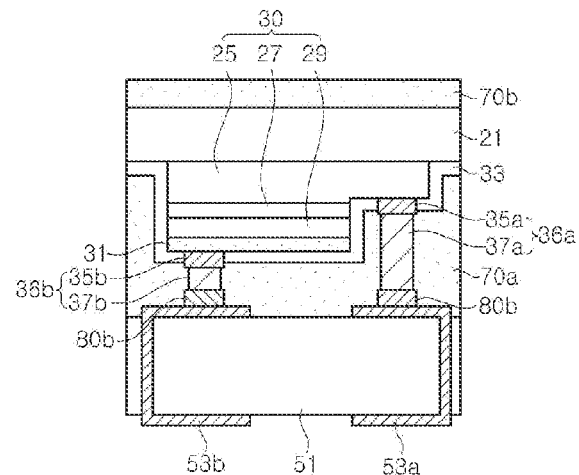

FIGS. 6a to 6c are sectional views illustrating a method of fabricating an LED package according to a sixth embodiment of the present invention.

Referring to FIG. 6a, a substrate assembly 20c according to this embodiment is different from the substrate assembly 20 of FIG. 1a or 5a in that the first wavelength converter 40a is not formed, and a PCB 50a is identical to that described with reference to FIG. 5a. That is, the conductive adhesives 80a and 80b are formed on the lead electrodes 53a and 53b of the PCB 50a, respectively.

Subsequently, as described with reference to FIG. 5b, the first and second electrodes 36a and 36b come in contact with the respective corresponding conductive adhesives 80a and 80b, and the conductive adhesives are then cured.

Referring to FIG. 6b, as described with reference to FIG. 3c, a first wavelength converter 70a is formed to fill in a space between the growth substrate 21 and the PCB 50a, and the second wavelength converter 70b is formed above the substrate 21.

Referring to FIG. 6c, an LED package is completed by dividing the substrate 21 and the PCB 50a together. Here, the first wavelength converter 70a fills in the space between the growth substrate 21 and the PCB 50a. Thus, the first wavelength converter 70a can stably fix the semiconductor stack structure 30 to the substrate 51.

FIGS. 7a to 7d are sectional views illustrating a method of fabricating an LED package according to a seventh embodiment of the present invention.

Figure 7A:
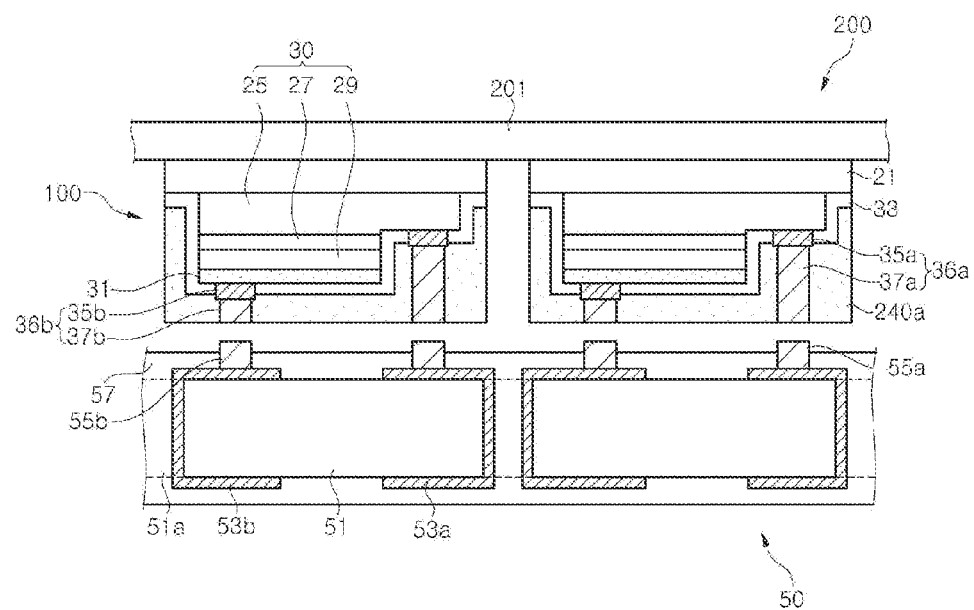
FIGS. 7a to 7d are sectional views illustrating a method of fabricating an LED package according to a seventh embodiment of the present invention.

Referring to FIG. 7a, in this embodiment, a substrate assembly 200 comprises a carrier substrate 201 and LED chips 100 temporarily attached on the carrier substrate 201. The LED chips 100 are aligned on the carrier substrate 201.

The LED chips 100 may be provided by attaching the substrate assembly 20 of FIG. 1a with the blue tape and then dividing the substrate assembly into individual LED chips through a process of scribing and breaking, sawing, or the like. Accordingly, each of the LED chips 100 comprises a growth substrate 21, a semiconductor stack structure 30 and a first wavelength converter 240a that covers the semiconductor stack structure 30.

These LED chips 100 are classified into superior and inferior LED chips through optical and electrical performance tests, and the superior LED chips 100 are aligned on the carrier substrate 201. Meanwhile, a PCB 50 may be prepared identically to the PCB 50 described with reference to FIG. 1a.

Figure 7B:
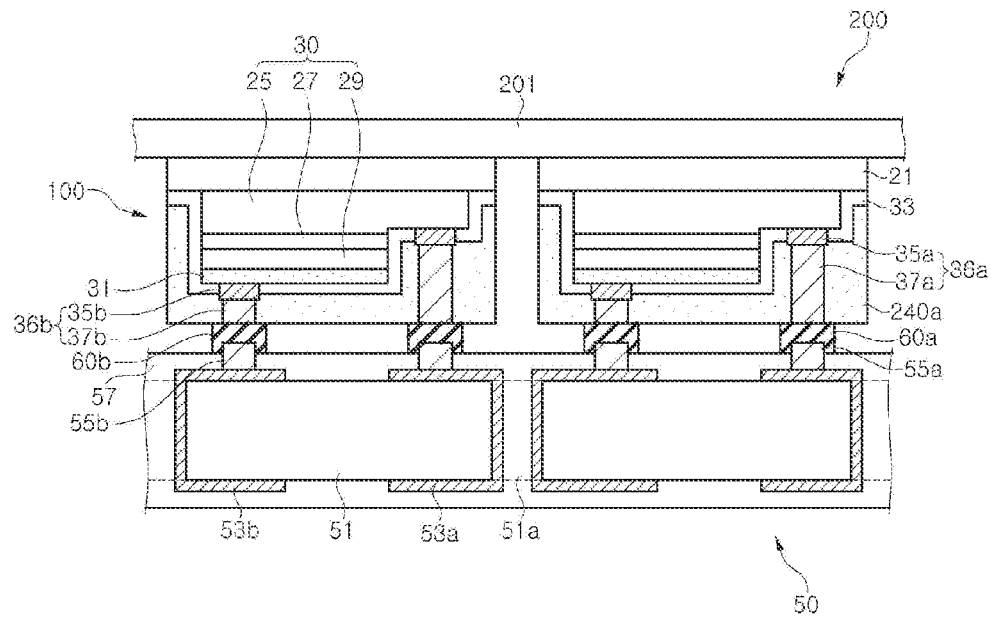

Referring to FIG. 7b, as described with reference to FIG. 1b, the first plating layer 60a is formed between the first electrode 36a and the first spacer electrode 55a, and the second plating layer 60b are formed between the second electrode 36b and the second spacer electrode 55b.

Figure 7C:
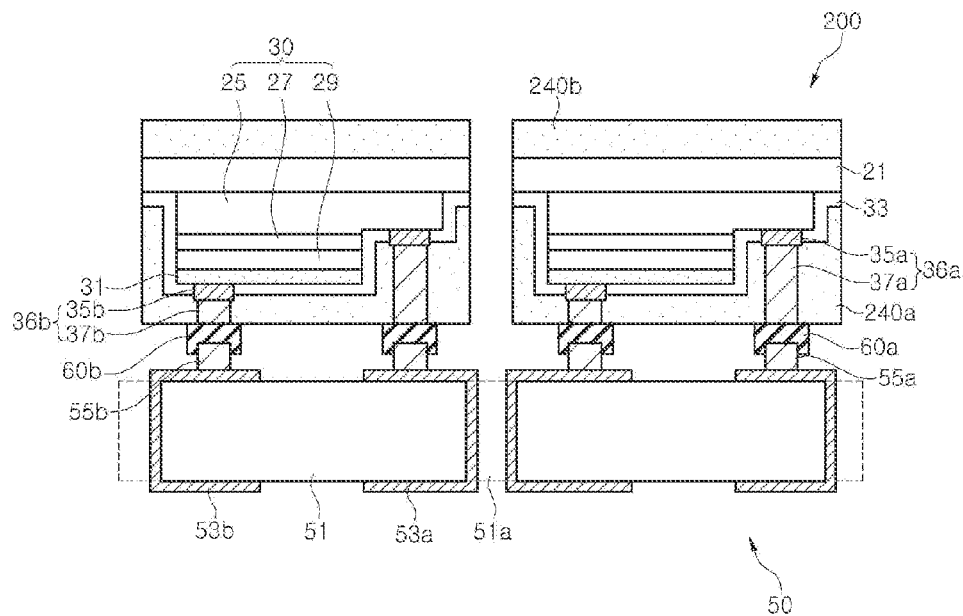

Referring to FIG. 7c, the anti-plating layer 57 and the carrier substrate 201 are removed, and a second wavelength converter 240b having a uniform thickness is formed on the growth substrate 21 of each of the LED chips. The second wavelength converter 240b may be formed by attaching a wavelength conversion sheet patterned to correspond to the growth substrate 21 or by using a resin containing phosphor.

Figure 7D:
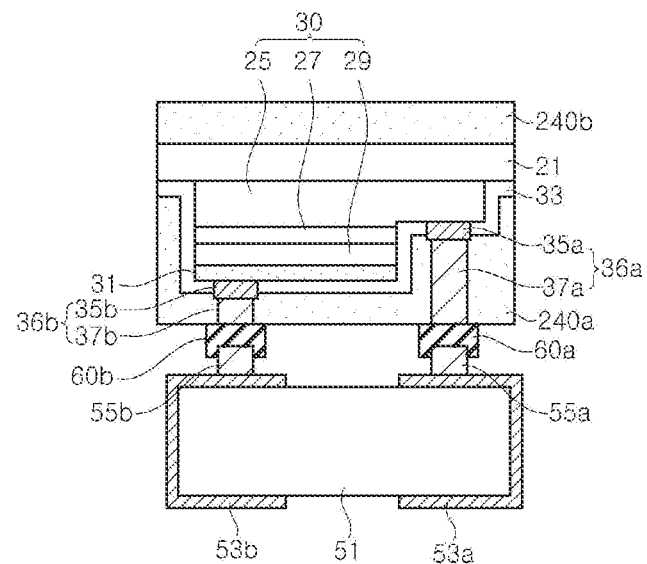

Referring to FIG. 7d, an individual LED package is completed by dividing the PCB 50. The PCB 50 may be divided by scribing and breaking, sawing, or the like.

In this embodiment, the LED chips 100 are divided to be separate from one another, and thus the LED package can be completed by dividing the PCB 50.

In this embodiment, the PCB 50 may be formed to have a final size relatively larger than that of the LED chip 100.

Although it has been described in this embodiment that the LED chips 100 are provided by dividing the substrate assembly 20 of FIG. 1a, the present invention is not limited thereto. That is, the LED chips may be provided by partitioning the substrate assembly 20b of FIG. 4a.

Figure 8:
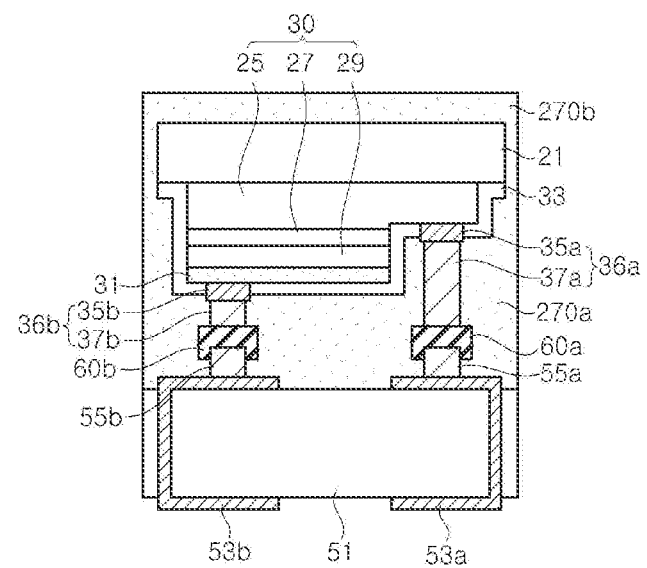
FIG. 8 is a sectional view illustrating a method of fabricating an LED package according to an eighth embodiment of the present invention.

FIG. 8 is a sectional view illustrating a method of fabricating an LED package according to an eighth embodiment of the present invention.

The method of fabricating the LED package according to this embodiment is almost similar to that according to the seventh embodiment, but is different in that LED chips do not comprise a first wavelength converter 240a. That is, the LED chips according to this embodiment may be provided, for example, by dividing the substrate assembly 20c described with reference to FIG. 6a.

As described with reference to FIG. 7a, these LED chips are classified into superior and inferior LED chips through optical and electrical performance tests, and the superior LED chips are aligned on the carrier substrate 201.

Subsequently, the anti-plating layer 67 described with reference to FIG. 3a is formed, and the plating layers 60a and 60b are formed using the electroplating bonding technique. Then, the plating layers 60a and 60b are removed, and a first wavelength converter 270a that fills in the space between the growth substrate 21 and the PCB 50 and a second wavelength converter 270b positioned on the growth substrate 21 may be formed. Further, the first and second wavelength converters 270a and 270b may be formed together or may cover the side surfaces of the growth substrate 21.

Subsequently, the LED package of FIG. 8 is completed by dividing the wavelength converters 270a and 270b together with the PCB 50.

Figure 9:
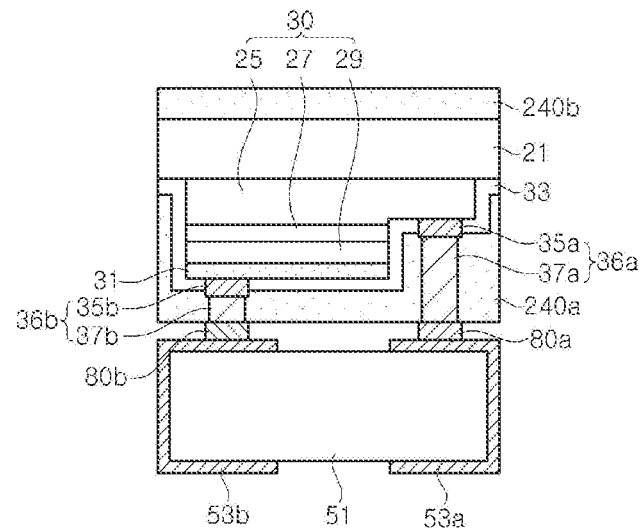
FIG. 9 is a sectional view illustrating a method of fabricating an LED package according to a ninth embodiment of the present invention.

FIG. 9 is a sectional view illustrating a method of fabricating an LED package according to a ninth embodiment of the present invention.

The method of fabricating the LED package according to this embodiment is identical in that the substrate assembly 200 of FIG. 7a is used, but is different in that the conductive adhesives 80a and 80b are formed on the respective lead electrodes 53a and 53b of the PCB, as is done for the PCB 50a of FIG. 5a.

The first and second electrodes 36a and 36b of each LED chip are bonded to the PCB 50a by the conductive adhesives 80a and 80b, respectively.

Then, the support substrate 201 is removed, and the second wavelength converter 240b is formed as described with reference to FIG. 7c. Subsequently, the LED package of FIG. 9 is completed by dividing the PCB 50a.

Figure 10:
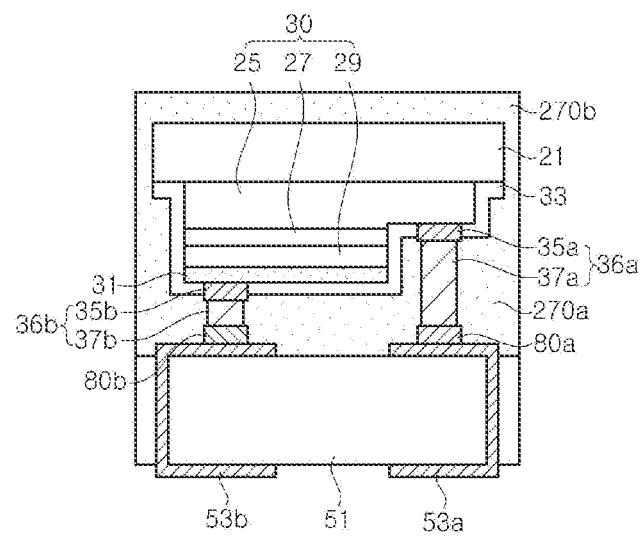
FIG. 10 is a sectional view illustrating a method of fabricating an LED package according to a tenth embodiment of the present invention.

FIG. 10 is a sectional view illustrating a method of fabricating an LED package according to a tenth embodiment of the present invention.

The method of fabricating the LED package according to this embodiment is almost identical to that according to the ninth embodiment, but is different in that LED chips do not comprise the first wavelength converter 240a. That is, the LED chips according to this embodiment may be provided, for example, by dividing the substrate assembly 20c described with reference to FIG. 6a.

Subsequently, the first and second electrodes 36a and 36b of each of the LED chips are bonded to the PCB 50a by the conductive adhesives 80a and 80b, respectively. Then, the support substrate 201 is removed, and the first and second wavelength converters 270a and 270b are formed as described with reference to FIG. 8. Subsequently, the LED package of FIG. 10 is completed by dividing the wavelength converters 270a and 270b together with the PCB 50a.

FIGS. 11a to 11d are sectional views illustrating a method of fabricating an LED package according to an eleventh embodiment of the present invention.

Figure 11A:
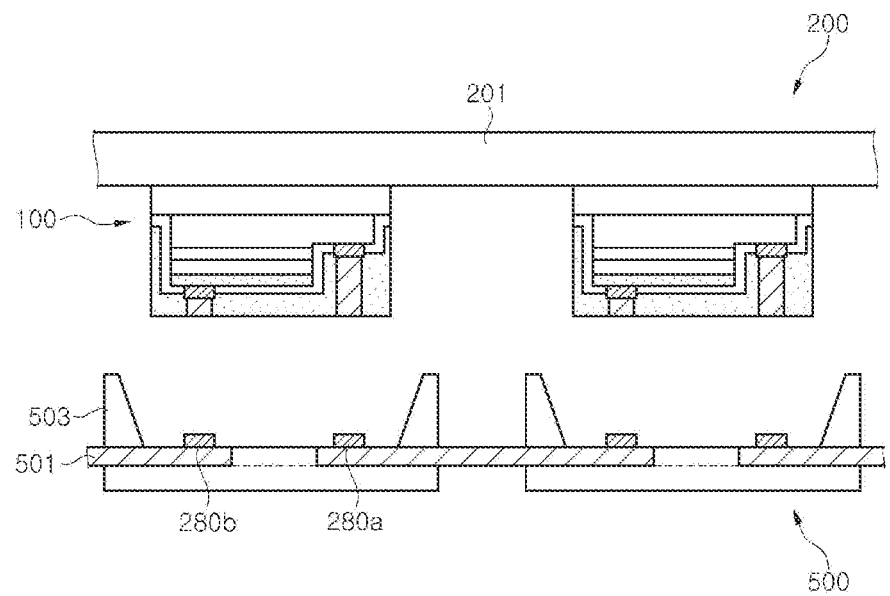
FIGS. 11a to 11d are sectional views illustrating a method of fabricating an LED package according to an eleventh embodiment of the present invention.

Referring to FIG. 11a, a substrate assembly 200 according to this embodiment is identical to that of FIG. 7a, but is different in that a packaging member 500 is a lead frame.

That is, the lead frame 501 through which a plurality of lead electrodes are electrically connected to one another is provided by performing a punching process on a copper plate. A plurality of housings 503 that respectively provide a recess for accommodating the LED chip 100 may be provided on the lead frame 501. The housings 503 may be formed by molding plastic, and the inner wall of each of the recesses may be provided as a reflection surface.

Meanwhile, first and second conductive adhesives 280a and 280b are formed on the lead electrodes in the recess, respectively.

Figure 11B:
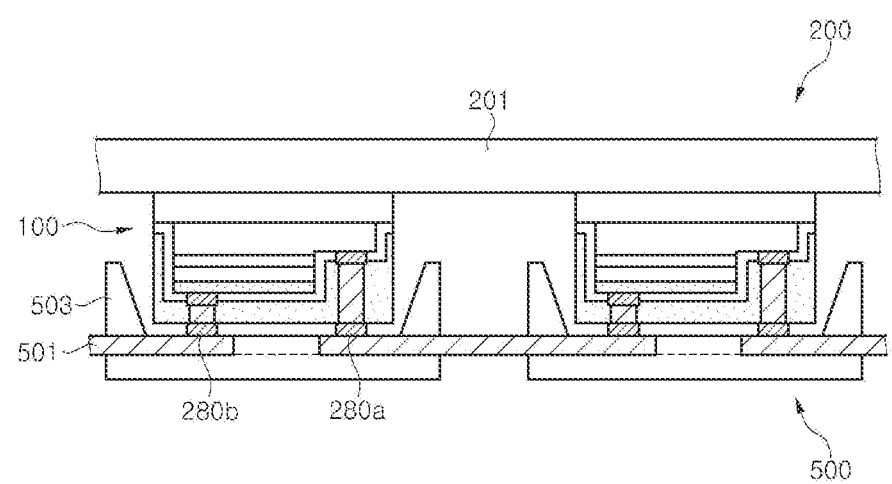

Referring to FIG. 11b, as described with reference to FIG. 5b, the first and second electrodes 36a and 36b are bonded to the respective corresponding conductive adhesives 80a and 80b, and the conductive adhesives are then cured.

Figure 11C:
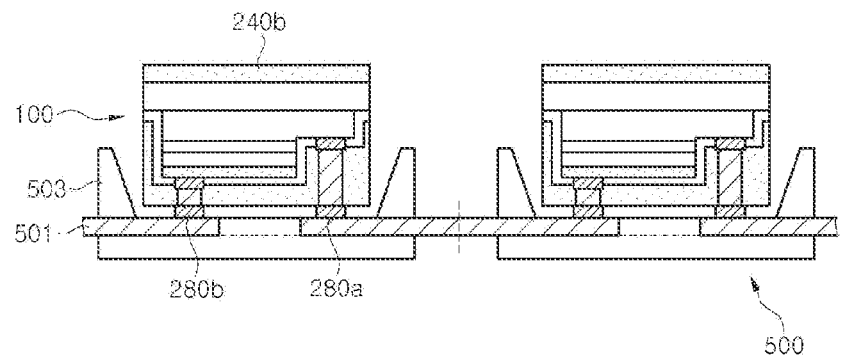

Referring to FIG. 11c, the support substrate 201 is removed, and the second wavelength converter 240b is formed on the LED chips 100. The second wavelength converter 240b may be formed by coating a wavelength conversion layer or by attaching a wavelength conversion sheet.

Figure 11D:
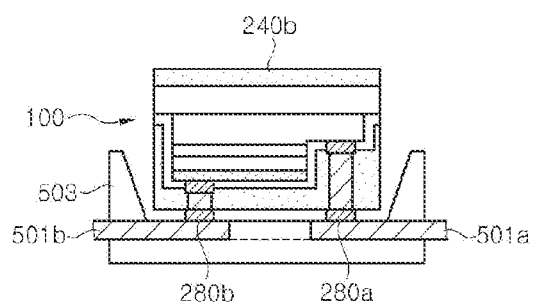

Referring to FIG. 11d, the lead frame 501 is divided into individual LED packages. Therefore, lead electrodes 501a and 501b may be extended to the outside of the LED package, and these external leads may be bent.

Although it has been described in this embodiment that the LED chips are bonded using the conductive adhesives 80a and 80b, the present invention is not limited thereto. That is, the LED chips 100 may be bonded to the lead frame using the electroplating bonding technique described above. In this case, since the lead frame 501 is conductive, a separate means for electrically connecting the lead electrodes is not required. Meanwhile, an anti-plating layer may be formed using photoresist so that electroplating can be performed only on specific parts of the lead electrodes.

In this embodiment, the LED chip 100 having the first wavelength converter 240a has been described as an example, but the first wavelength converter 240a may be omitted.

Meanwhile, although it has been described in the aforementioned embodiments that the semiconductor stack structure 30 or LED chip 100 is formed of one diode element, the present invention is not limited thereto. That is, the individual semiconductor stack structure or LED chip 100 corresponding to a unit chip may have a plurality of light emitting cells spaced apart from one another.

Figure 12:
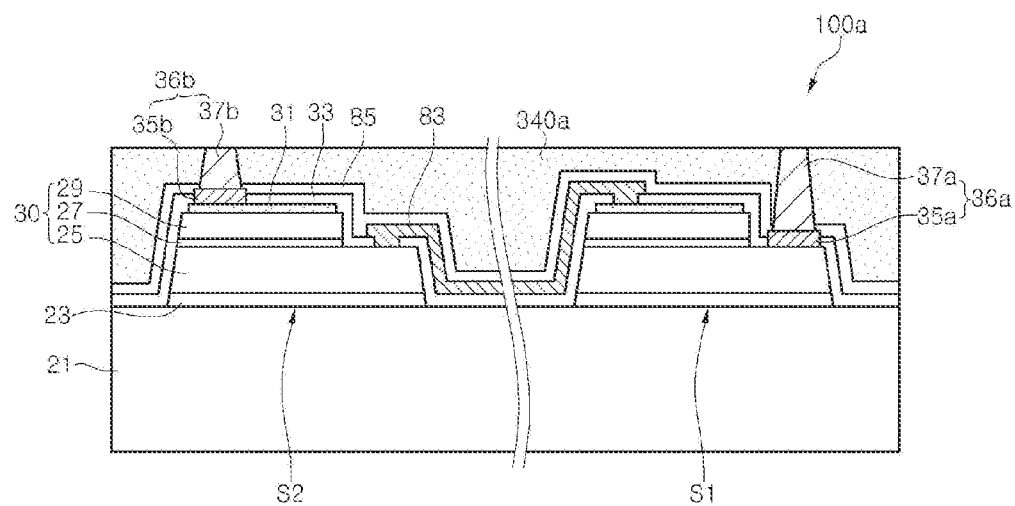
FIG. 12 is a sectional view illustrating a semiconductor stack structure having a plurality of light emitting cells which can be applied to the embodiments of the present invention.

FIG. 12 is a sectional view illustrating a semiconductor stack structure having a plurality of light emitting cells which can be applied to the embodiments of the present invention. Here, the substrate 21 divided into individual LED chips 100a will be described as an example for the convenience of illustration.

Referring to FIG. 12, the LED chip 100a is almost identical to the LED chip 100 described with reference to FIG. 7a, but is different in that the semiconductor stack structure 30 is divided into a plurality of light emitting cells S1 and S2 on the substrate 21. Although only two light emitting cells S1 and S2 are shown in FIG. 12, further more light emitting cells may be formed. The buffer layer 23 is also interposed between the first conductive semiconductor layer 25 and the substrate 21.

The light emitting cells S1 and S2 may be electrically connected to each other by an interconnector 83. The interconnector 83 may connect the first conductive semiconductor layer 25 of one light emitting cell to the second conductive semiconductor layer 29 of another light emitting cell adjacent to the one light emitting cell, thereby forming a serial array. Such serial arrays may be connected in parallel or reverse parallel. The interconnector 83 may be electrically connected to the second conductive semiconductor layer 29 through the ohmic contact layer 31 formed on the second conductive semiconductor layer 29. Side surfaces of the light emitting cells S1 and S2 may be formed inclined to facilitate the formation of interconnectors 83.

Meanwhile, the insulating layer 33 covers the ohmic contact layer 31, and covers the side surfaces of the light emitting cells S1 and S2 in order to prevent the first and second conductive semiconductor layers 25 and 29 of the light emitting cells S1 and S2 from being short-circuited by the interconnector 83.

Meanwhile, the first electrode 36a may be positioned on the light emitting cell S1, and the second electrode 36b may be positioned on the light emitting cell S2. However, in this embodiment, the positions at which the first and second electrodes 36a and 36b are formed, respectively, are not limited particularly. For example, both the first and second electrodes 36a and 36b may be formed on the substrate 21, and may be connected to the light emitting cells S1 and S2 through interconnectors 83, respectively. The first and second electrodes 36a and 36b may be formed on the first conductive semiconductor layers 25 or second conductive semiconductor layers 29 of the light emitting cells S1 and S2, respectively. In a case where the first and second electrodes 36a and 36b are formed on the same plane, top surfaces of the first and second electrodes may be positioned on the same plane by forming the first and second electrodes 36a and 36b to have the same height.

The interconnectors 83 and the insulating layer 33 may be covered by a second insulating layer 85. The second insulating layer 85 may be formed of the same material as that of the insulating layer 33, and protects the interconnectors 83 and the light emitting cells S1 and S2. In this case, the second insulating layer 85 may be relatively thinner than the insulating layer 33 in order to prevent the second insulating layer 85 from being exfoliated from the insulating layer 33.

A first wavelength converter 340a covers the plurality of light emitting cells S1 and S2, and the first and second electrodes 36a and 36b are exposed to the outside through the first wavelength converter 340a.

Here, the LED chip 100a having the first wavelength converter 340a previously formed therein has been described as an example. However, the first wavelength converter 340a may be omitted.

Here, the LED chip 100a having the plurality of light emitting cells has been described as an example. However, as described with reference to FIG. 1a or 3a, the substrate 21 may be provided as a substrate assembly while it is not divided into individual LED chips 100a, and the substrate 21 may be divided when the PCB or the lead frame is divided.

While the present invention has been described in connection with the preferred embodiments, it will be understood by those skilled in the art that various modifications and changes can be made thereto without departing from the spirit and scope of the invention defined by the appended claims.

What is claimed:

1. A semiconductor device, comprising:
   a member comprising a first lead electrode and a second lead electrode;
   a semiconductor stack structure disposed on the member, the semiconductor stack structure comprising a first conductive semiconductor layer, a second conductive semiconductor layer, and an active region interposed between the first and second conductive semiconductor layers;
   a first electrode electrically connected to the first conductive semiconductor layer;
   a second electrode electrically connected to the second conductive semiconductor layer;
   a plating layer configured to bond the semiconductor stack structure to the member;
   spacer electrodes respectively disposed on the first and second lead electrodes; and
   a first wavelength converter that covers at least side surfaces of the semiconductor stack structure,
   wherein the first electrode comprises a first electrode pad and a first additional electrode disposed on the first electrode pad,
   wherein the second electrode comprises a second electrode pad and a second additional electrode disposed on the second electrode pad,
   wherein the plating layer comprises a first plating layer configured to bond the first additional electrode to the spacer electrode on the first lead electrode, and a second plating layer configured to bond the second additional electrode to the spacer electrode on the second lead electrode,
   wherein the first wavelength converter extends to a space between the semiconductor stack structure and the member and covers the semiconductor stack structure, and
   wherein the first and second plating layers cover a top surface and only a portion of respective side surfaces of the spacer electrodes.

2. The semiconductor device of claim 1, further comprising a second wavelength converter having a uniform thickness and disposed on an upper surface of the semiconductor stack structure opposite to the member.

3. The semiconductor device of claim 2, wherein the first wavelength converter and the second wavelength converter are spaced apart from each other.

4. The semiconductor device of claim 2, wherein the second wavelength converter contacts the first conductive semiconductor layer.

5. The semiconductor device of claim 2, further comprising a growth substrate disposed on the semiconductor stack structure opposite to the member, wherein the second wavelength converter is disposed on the growth substrate.

6. The semiconductor device of claim 1, wherein the member is a printed circuit board (PCB) or a lead frame.

7. A semiconductor device, comprising:
- a member comprising a first lead electrode and a second lead electrode;
- a semiconductor stack structure disposed on the member, the semiconductor stack structure comprising a first conductive semiconductor layer, a second conductive semiconductor layer, and an active region interposed between the first and second conductive semiconductor layers;
- a first plating layer and a second plating layer configured to bond the semiconductor stack structure to the member;
- spacer electrodes respectively disposed on the first and second lead electrodes; and
- a first wavelength converter that covers at least side surfaces of the semiconductor stack structure,
- wherein the first wavelength converter extends to a space between the semiconductor stack structure and the member and covers the semiconductor stack structure,
- wherein the first and second plating layers bond the semiconductor stack structure to the spacer electrodes, respectively, and
- wherein the first and second plating layers cover a top surface and only a portion of respective side surfaces of the spacer electrodes.

8. A semiconductor device, comprising:
- a member comprising a first lead electrode and a second lead electrode;
- a semiconductor stack structure disposed on the member, the semiconductor stack structure comprising a first conductive semiconductor layer, a second conductive semiconductor layer, and an active region interposed between the first and second conductive semiconductor layers;
- a first plating layer and a second plating layer configured to bond the semiconductor stack structure to the member;
- spacer electrodes respectively disposed on the first and second lead electrodes; and
- a second wavelength converter having a uniform thickness and disposed on an upper surface of the semiconductor stack structure opposite to the member,
- wherein the first and second plating layers bond the semiconductor stack structure to the spacer electrodes, respectively, and
- wherein the first and second plating layers cover a top surface and only a portion of respective side surfaces of the spacer electrodes.

9. The semiconductor device of claim 8, further comprising a first wavelength converter that covers at least side surfaces of the semiconductor stack structure, wherein the first and second wavelength converters are spaced apart from each other.

10. The semiconductor device of claim 8, wherein the second wavelength converter contacts the first conductive semiconductor layer.

11. The semiconductor device of claim 8, further comprising a growth substrate disposed on the semiconductor stack structure opposite to the member, wherein the second wavelength converter is disposed on the growth substrate.

* * * * *